(12) United States Patent
Hashimoto et al.

(10) Patent No.: US 8,357,243 B2
(45) Date of Patent: Jan. 22, 2013

(54) METHOD FOR TESTING GROUP III-NITRIDE WAFERS AND GROUP III-NITRIDE WAFERS WITH TEST DATA

(75) Inventors: Tadao Hashimoto, Santa Barbara, CA (US); Masanori Ikari, Santa Barbara, CA (US); Edward Letts, Buellton, CA (US)

(73) Assignee: Sixpoint Materials, Inc., Buellton, CA (US)

( * ) Notice: Subject to any disclaimer, the term of this patent is extended or adjusted under 35 U.S.C. 154(b) by 894 days.

(21) Appl. No.: 12/456,181

(22) Filed: Jun. 12, 2009

(65) Prior Publication Data
US 2009/0315151 A1 Dec. 24, 2009

Related U.S. Application Data

(60) Provisional application No. 61/131,917, filed on Jun. 12, 2008.

(51) Int. Cl.
C30B 23/00 (2006.01)
C30B 25/00 (2006.01)
C30B 28/12 (2006.01)
C30B 28/14 (2006.01)

(52) U.S. Cl. .............. 117/101; 117/84; 117/85; 117/88; 117/97

(58) Field of Classification Search .............. 117/14, 117/84, 85, 88, 97, 101
See application file for complete search history.

(56) References Cited

U.S. PATENT DOCUMENTS

| | | | |
|---|---|---|---|
| 5,942,148 A * | 8/1999 | Preston | 252/62.3 GA |
| 6,177,057 B1 | 1/2001 | Purdy | |
| 6,177,059 B1 | 1/2001 | Matsuda et al. | |
| 6,316,785 B1 | 11/2001 | Nunoue et al. | |
| 6,398,867 B1 | 6/2002 | D'Evelyn et al. | |
| 6,406,540 B1 | 6/2002 | Harris | |
| 6,441,393 B2 | 8/2002 | Goetz et al. | |
| 6,569,238 B2 * | 5/2003 | Ishida | 117/84 |
| 6,656,615 B2 | 12/2003 | Dwilinski et al. | |
| 7,033,439 B2 | 4/2006 | Shibata et al. | |
| 7,078,731 B2 * | 7/2006 | D'Evelyn et al. | 257/94 |
| 7,132,730 B2 | 11/2006 | Dwilinski et al. | |
| 7,160,388 B2 | 1/2007 | Dwilinski et al. | |

(Continued)

FOREIGN PATENT DOCUMENTS

EP 1 110 600 A2 6/2001

(Continued)

OTHER PUBLICATIONS

PCT/US2009/035140, WO International Search Report dated May 29, 2009, pp. 4.

(Continued)

Primary Examiner — James McDonough
(74) Attorney, Agent, or Firm — K&L Gates LLP

(57) ABSTRACT

The present invention discloses a new testing method of group III-nitride wafers. By utilizing the ammonothermal method, GaN or other Group III-nitride wafers can be obtained by slicing the bulk GaN ingots. Since these wafers originate from the same ingot, these wafers have similar properties/qualities. Therefore, properties of wafers sliced from an ingot can be estimated from measurement data obtained from selected number of wafers sliced from the same ingot or an ingot before slicing. These estimated properties can be used for product certificate of untested wafers. This scheme can reduce a significant amount of time, labor and cost related to quality control.

30 Claims, 8 Drawing Sheets

U.S. PATENT DOCUMENTS

| | | | |
|---|---|---|---|
| 7,169,227 B2 | 1/2007 | Maruska et al. | |
| 7,170,095 B2 * | 1/2007 | Vaudo et al. | 257/76 |
| 7,303,632 B2 | 12/2007 | Negley | |
| 7,368,015 B2 | 5/2008 | D'Evelyn et al. | |
| 2002/0078881 A1 | 6/2002 | Cuomo et al. | |
| 2002/0144645 A1 | 10/2002 | Kim et al. | |
| 2002/0192507 A1 | 12/2002 | Dwilinski et al. | |
| 2003/0024475 A1 | 2/2003 | Anderson | |
| 2004/0051105 A1 | 3/2004 | Tsuda et al. | |
| 2004/0072383 A1 | 4/2004 | Nagahama et al. | |
| 2004/0124434 A1 | 7/2004 | D'Evelyn et al. | |
| 2004/0226588 A1 | 11/2004 | Onishi et al. | |
| 2004/0245535 A1 | 12/2004 | D'Evelyn et al. | |
| 2004/0261692 A1 | 12/2004 | Dwilinski et al. | |
| 2004/0262630 A1 | 12/2004 | Kitaoka et al. | |
| 2005/0053513 A1 | 3/2005 | Pike, Jr. | |
| 2005/0098095 A1 | 5/2005 | D'Evelyn et al. | |
| 2005/0121688 A1 | 6/2005 | Nagai et al. | |
| 2005/0142391 A1 | 6/2005 | Dmitriev et al. | |
| 2005/0161697 A1 | 7/2005 | Nakahata et al. | |
| 2005/0166835 A1 | 8/2005 | Koukitsu et al. | |
| 2005/0224783 A1 | 10/2005 | Matsuyama et al. | |
| 2005/0258451 A1 | 11/2005 | Saxler et al. | |
| 2006/0054076 A1 | 3/2006 | Dwilinski et al. | |
| 2006/0057749 A1 | 3/2006 | Dwilinski et al. | |
| 2006/0118799 A1 | 6/2006 | D'Evelyn et al. | |
| 2006/0210800 A1 | 9/2006 | Spitsberg et al. | |
| 2006/0255341 A1 | 11/2006 | Pinnington et al. | |
| 2006/0282229 A1 | 12/2006 | Kim et al. | |
| 2007/0012242 A1 | 1/2007 | Jurisch et al. | |
| 2007/0032046 A1 | 2/2007 | Dmitriev et al. | |
| 2007/0084399 A1 | 4/2007 | Sarayama et al. | |
| 2007/0158785 A1 * | 7/2007 | D'Evelyn et al. | 257/615 |
| 2007/0234946 A1 | 10/2007 | Hashimoto et al. | |
| 2007/0290230 A1 | 12/2007 | Kawaguchi et al. | |
| 2008/0001165 A1 | 1/2008 | Hashimoto et al. | |
| 2008/0006844 A1 | 1/2008 | D'Evelyn et al. | |
| 2008/0008855 A1 | 1/2008 | D'Evelyn et al. | |
| 2008/0102016 A1 | 5/2008 | Hashimoto et al. | |
| 2008/0118733 A1 | 5/2008 | Oshima | |
| 2009/0256240 A1 | 10/2009 | Hashimoto et al. | |
| 2009/0309105 A1 | 12/2009 | Letts et al. | |
| 2010/0068118 A1 | 3/2010 | Hashimoto et al. | |
| 2010/0095882 A1 | 4/2010 | Hashimoto et al. | |
| 2010/0126411 A1 | 5/2010 | Letts et al. | |

FOREIGN PATENT DOCUMENTS

| | | |
|---|---|---|
| EP | 1 818 429 A2 | 8/2007 |
| JP | 2004-002152 | 8/2004 |
| JP | 2004-284876 | 10/2004 |
| JP | 2005-008444 | 1/2005 |
| JP | 2005-288350 | 10/2005 |
| JP | 2007-290921 | 10/2005 |
| WO | WO 03-035945 A2 | 5/2003 |
| WO | WO 2004-003261 A1 | 1/2004 |
| WO | WO 2004-061923 A1 | 7/2004 |
| WO | WO 2006-057463 A1 | 6/2006 |
| WO | WO 2006-080959 A1 | 8/2006 |
| WO | WO 2007-008198 A1 | 1/2007 |
| WO | WO 2007-078844 A2 | 7/2007 |
| WO | WO 2007-117689 A2 | 10/2007 |
| WO | WO 2007-133512 A2 | 11/2007 |
| WO | WO 2007-149487 A2 | 12/2007 |
| WO | WO 2008-051589 A2 | 5/2008 |
| WO | WO 2009-039398 A1 | 3/2009 |
| WO | WO 2009-108700 A1 | 9/2009 |
| WO | WO 2009-149299 A1 | 12/2009 |
| WO | WO 2009-149300 A1 | 12/2009 |
| WO | WO 2009-151642 A1 | 12/2009 |
| WO | WO 2010-045567 A1 | 4/2010 |
| WO | WO 2010-060034 A1 | 5/2010 |

OTHER PUBLICATIONS

PCT/US2009/035140, WO Written Opinion dated May 29, 2009, pp. 6.

PCT/US2009/035140, WO International Preliminary Report on Patentability dated Mar. 17, 2010, pp. 8.

PCT/US2009/046316, WO International Search Report and Written Opinion dated Oct. 22, 2009, pp. 18.

PCT/US2009/061022, WO International Search Report and Written Opinion dated Jan. 21, 2010, pp. 10.

PCT/US2009/003557, WO International Search Report dated Oct. 26, 2009 pp. 4.

PCT/US2009/046317, WO International Search Report and Written Opinion, dated Sep. 25, 2009 pp. 15.

PCT/US2009/065513, WO International Search Report and Written Opinion, dated Feb. 3, 2010; pp. 15.

Aoki, M., et al., "GaN single crystal growth using high-purity Na as a flux," Journal of Crystal Growth, 2002, pp. 70-76; 242; Elsevier, www.elsevier.com/locate/jcrysgro.

Bliss, D. F., et al., "Aluminum nitride substrate growth by halide vapor transport epitaxy," Journal of Crystal Growth, 2003, pp. 1-6, vol. 250; Elsevier, www.elsevier.com/locate/jerysgro.

Callahan, Michael J., et al "Growth of GaN crystals under ammonothermal conditions," Material Research Society, vol. 798, 2004, pp. YS.10.1-Y2.10.6.

Callahan, M., et al., "Gan single crystals grown on HVPE seeds in alkaline supercritical ammonia," J Mater Sci, 2006, pp. 1399-1407, 41.

Chen, Q. S., et al., "Modeling of ammonothermal growth of nitrides," Journal of Crystal Growth, 2003, pp, 181-187, 258; Elsevier, www.elsevier.com/locate/jcrysgro.

Dwilinski, R., et al., "AMMONO method of BN, AlN, and GaN synthesis and crystal growth," MRS Internet Journal of Nitride Semiconductor Research, 1998, pp. 1-4; 3, 25.

Dwilinski, R., et al., AMMONO method of GaN and AlN production, Diamond and Related Materials, 1998, pp. 1348-1350, 7; Elsevier.

Dwilinski, R., et al., "On GaN Crystallization by Ammonothermal Method," ACTA PHYSICA POLONICA A, 1996, pp. 763-766, No. 4, vol. 90.

Dwilinski, R., et al., "Excellent crystallinity of truly bulk ammonothermal GaN," Journal of Crystal Growth, 2008, pp. 3911-3916, 310; Elsevier, www.elsevier.com/locate/jcrysgro.

Ehrentraut, Dirk., et al., "Reviewing recent development in the acid ammonothermal crystal growth of gallium nitride," Journal of Crystal Growth, 2008, pp. 3902-3906, 310; Elsevier, www.elsevier.com/locate/jcrysgro.

Etzkorn, E. V., et al. "Cracking of GaN Films" Journal of Applied Physics, Jan. 15, 2001, pp. 1025-1034, vol. 89, No. 2, XP001011762, American Institute of Physics.

Hashimoto, Tadao et al. "A GaN bulk crystal with improved structural quality grown by the ammonothermal method," Published online: Jul. 2007; Nature Materials Advance Online Publication www.nature.com/naturematerials; pp. 1-3.

Hashimoto, Tadao et al. "Ammonothermal growth of GaN utilizing negative temperature dependence of solubility in basic ammonia" Mater. Res. Soc. Symp. Proc., 2005, pp. E2.8.1.-E.2.8.6., vol. 831, Materials Research Society.

Hashimoto, Tadao et al. "Growth of Bulk GaN Crystals by the Basic Ammonothermal Method," Japanese Journal of Applied Physics, 2007, pp. L889-L891, vol. 46, No. 37, The Japanese Society of Applied Physics, JJAP Express Letter.

Hashimoto, Tadao et al. "Growth of bulk GaN with Low Dislocation Density by the Ammonothermal Method Using Polycrystalline GaN Nutrient" Japanese Journal of Applied Physics, 2007, pp. L525-L527, vol. 46, No, 22, The Japanese Society of Applied Physics, JJAP Express Letter.

Hashimoto, Tadao at al. "Growth of gallium nitride via fluid transport in supercritical ammonia," Journal of Crystal Growth, 2005, pp. e525-e530; 275, Elsevier, www.elsevier.com/locate/jcrysgro.

Hashimoto, Tadao at at "Phase selection of microcrystalline GaN synthesized in supercritical ammonia" Journal of Crystal Growth, 2006, pp. 100-106; 291, Elsevier, www.elsevier.com/locate/jcrysgro.

Hashimoto, Tadao at al. "Seeded growth of GaN by the basic ammonothermal method" Journal of Crystal Growth, 2007, pp. 311-316; 305, Elsevier, www.eisevier.com/locate/jcrysgro.

Hashimoto, Tadao at al. "Status and perspectives of the ammonothermal growth of GaN substrates" Journal of Crystal Growth, 2008, pp. 876-880; 310, Elsevier, www.elsevier.com/locate/jcrysgro.

Hashimoto, Tadao et al. "Structural Characterization of Thick GaN Films Grown of Free-Standing GaN Seeds by the Ammonothermal Method Using Basic Ammonia," Japanese Journal of Applied Physics, 2005, pp. L 797-L 799, vol. 44, No. 25, The Japan Society of Applied Physics, JJAP Express Letter.

Hashimoto, Tadao et al., "Ammonothermal growth of bulk GaN," Journal of Crystal Growth, 2008, pp. 3907-3910; 310; Elsevier, www.elsevier.com/locate/jcrysgro.

Hashimoto, Tadao et al., "Ammonothermal Growth of GaN on an over-1-inch Seed Crystal," Japanese Journal of Applied Physics, 2005, pp. L 1570-L 1572, vol. 44, No. 52, The Japan Society of Applied Physics, JJAP Express Letter.

Inoue, T., et al., "Pressure-Controlled Solution Growth of Bulk GaN Crystals under High Pressure," 2001, pp. 15-27; 223, 15, Phys. Stat. Sol. (b).

Iwahashi, et al., "Effects of ammonia gas on threshold pressure and seed growth for bulk GaN single crystals by Na flux method," Journal of Crystal Growth, 2003, pp. 1-5, 253; Elsevier, www.elsevier.com/locate/jcrysgro.

Ketchum, Douglas R., et al. "Crystal growth of gallium nitride in supercritical ammonia," Journal of Crystal Growth, 2001, pp. 431-434, 222; Elsevier, www.elsevier.nl/locate/jcrysgro.

Kumagai, Y., et al., "Growth of thick AlN layers by hydride vapor phase epitaxy," Journal Crystal Growth, 2005, pp. 62-67, vol. 281; Elsevier, www.elsevier.com/locate/jcrysgro.

Kumagai, Y., et al., "Hydride vapor phase epitaxy of AlN: thermodynamic analysis of aluminum source and its application to growth," Phys. Stat. Sol. ( c), 2003, pp. 2498-2501, vol. 0, No. 7.

Ledyaev, O., et al., Properties of AlN Layers Grown on SiC Substrates in Wide Temperature Range by HVPE, Phys. Stat. Sol. ( c), 2002, pp. 474-478, No. 1.

Ohshima, E., et al., "Growth of the 2-in-size bulk ZnO single crystals by the hydrothermal method," Journal of Crystal Growth, 2004, pp. 166-170, 260; Elsevier, www.elsevier.com/locate/jcrysgro.

Peters, D. et al., "Ammonothermal Synthesis of Aluminum Nitride," Journal of Crystal Growth, 1990, pp. 411-418, 104.

Porowski. S., "Near Defect Free GaN Substrates," MRS Internet Journal of Nitride Semiconductors, Res, 4S1, 1999, G1.3.

Purdy, A. P., et al. "Ammonothermal Recrystallization of Gallium Nitride with Acidic Mineralizers," Cyst. Growth Design, 2002, pp. 141-145, vol. 2, No. 2.

Ramachandran, V. et al., "Inversion of wurtzite GaN(0001) by exposure to magnesium," Applied Physics Letters, Aug. 9, 1999, pp. 808-810, vol. 75, No. 6.

Wu, H. at al., "Rapid Synthesis of High Purity GaN Powder," Phys. Stat. Sol. (c), 2005, pp. 2074-2078, New York.

Yamane, Y., et al., "Growth of thick AlN layer on sapphire (0001) substrate using hydride vapor phase epitaxy," Phys. Stat. Sol. ( c), 2005, pp. 2062-2065, vol. 2, No. 7.

* cited by examiner

METHOD FOR TESTING GROUP III-NITRIDE WAFERS AND GROUP III-NITRIDE WAFERS WITH TEST DATA

CROSS REFERENCE TO RELATED APPLICATIONS

This application claims the benefit of priority to U.S. application Ser. No. 61/131,917, filed Jun. 12, 2008 and entitled "Method for Testing Group III-Nitride Wafers and Group III-Nitride Wafers with Test Data", inventors Tadao Hashimoto, Masanori Ikari, and Edward Letts, the contents of which are incorporated by reference herein as if put forth in full below. This application is also related to the PCT application filed Jun. 12, 2009, entitled "Method for Testing Group III-Nitride Wafers and Group III-Nitride Wafers with Test Data," inventors Tadao Hashimoto, Masanori Ikari, and Edward Letts, the contents of which are incorporated by reference in their entirety as if put forth in full below.

This application is also related to the following co-pending U.S. patent applications:

PCT Utility Patent Application Ser. No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,";

U.S. Utility Patent Application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,"which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN AND LARGE SURFACE AREA GALLIUM NITRIDE CRYSTALS,";

U.S. Utility Patent Application Ser. No. 60/973,602, filed on Sep. 19, 2007, by Tadao Hashimoto and Shuji Nakamura, entitled "GALLIUM NITRIDE BULK CRYSTALS AND THEIR GROWTH METHOD,"

U.S. Utility Patent Application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY,";

U.S. Utility Patent Application Ser. No. 61/067,117, filed on Feb. 25, 2008, by Tadao Hashimoto, Edward Letts, Masanori Ikari, entitled "METHOD FOR PRODUCING GROUP III-NITRIDE WAFERS AND GROUP III-NITRIDE WAFERS,".

U.S. Utility Patent Application Ser. No. 61/058,900, filed on Jun. 4, 2008, by Edward Letts, Tadao Hashimoto, Masanori Ikari, entitled "METHOD FOR PRODUCING IMPROVED CRYSTALLINITY GROUP III-NITRIDE CRYSTALS FROM INITIAL GROUP III-NITRIDE SEED BY AMMONOTHERMAL GROWTH,".

U.S. Utility Patent Application Ser. No. 61/058,910, filed on Jun. 4, 2008, by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL,".

which applications are incorporated by reference herein.

BACKGROUND

1. Field of the Invention

The invention is related to the production method of group III-nitride wafers using ammonothermal method and subsequent testing method and the group III-nitride wafers with test certificate data.

2. Description of the Existing Technology (Note: This patent application refers several publications and patents as indicated with numbers within brackets, e.g., [x]. A list of these publications and patents can be found in the section entitled "References.")

Gallium nitride (GaN) and its related group III alloys are important materials for various opto-electronic and electronic devices such as light emitting diodes (LEDs), laser diodes (LDs), microwave power transistors, and solar-blind photo detectors. Currently LEDs are widely used in cell phones, indicators, displays, and LDs are used in data storage discs. However, the majority of these devices are grown epitaxially on heterogeneous substrates, such as sapphire and silicon carbide since GaN wafers are extremely expensive compared to these heteroepitaxial substrates. The heteroepitaxial growth of group III-nitride causes highly defected or even cracked films, which hinders the realization of high-end optical and electronic devices, such as high-brightness LEDs for general lighting or high-power microwave transistors.

To solve problems caused by heteroepitaxy, it is helpful to utilize single crystalline group III-nitride wafers sliced from bulk group III-nitride crystal ingots. For a majority of devices, single crystalline GaN wafers are favored because it is relatively easy to control the conductivity of the wafer, and a GaN wafer will provide small lattice/thermal mismatch with device layers. However, due to the high melting point and high nitrogen vapor pressure at high temperature, it has been difficult to grow group III-nitride crystal ingots. Growth methods using molten Ga, such as high-pressure high-temperature synthesis [1,2] and sodium flux [3,4], have been proposed to grow GaN crystals. However, the crystal shape grown in molten Ga becomes a thin platelet because molten Ga has low solubility of nitrogen and a low diffusion coefficient of nitrogen.

Currently, only hydride vapor phase epitaxy (HVPE) can produce commercial GaN wafers. In HVPE, a thick (0.5-3 mm) GaN film is grown on a heteroexpitaxial substrate such as sapphire or gallium arsenide. The substrate is subsequently removed and a free-standing GaN wafer is finished by grinding and polishing. Since the GaN wafer is produced one by one on each heterogeneous substrate, each produced GaN wafer is tested before shipping. However, as the production volume increases, it becomes extremely time consuming to test all wafers before shipping.

SUMMARY OF THE INVENTION

The present invention discloses a new production and testing method for group III-nitride wafers. An ammonothermal method, which is a solution growth method using high-pressure ammonia as a solvent, has demonstrated successful growth of real bulk GaN ingots [see generally references 5-8 for ammonothermal growth]. By utilizing the ammonothermal method, GaN wafers can be obtained by slicing the bulk GaN ingots. Since these wafers originate from the same ingot, these wafers have similar properties/qualities. Therefore, test data obtained from the ingot before slicing or one or more selected wafers from an ingot can represent properties of other wafers from the same ingot. This scheme will cut significantly the amount of time, labor and cost related to quality control.

BRIEF DESCRIPTION OF THE DRAWINGS

Referring now to the drawings in which like reference numbers represent corresponding parts throughout.

1. High-pressure vessel
2. Lid
3. Clamp
4. Gasket
5. Heater(s) for the crystallization region
6. Heater(s) for the dissolution region
7. Flow-restricting baffle(s)
8. Nutrient basket
9. Nutrient
10. Seed crystals
11. Flow-restricting baffle(s)
12. Blast containment enclosure
13. Valve
14. Exhaust tube
15. Device to operate valve

DETAILED DESCRIPTION OF THE INVENTION

Figure 1:
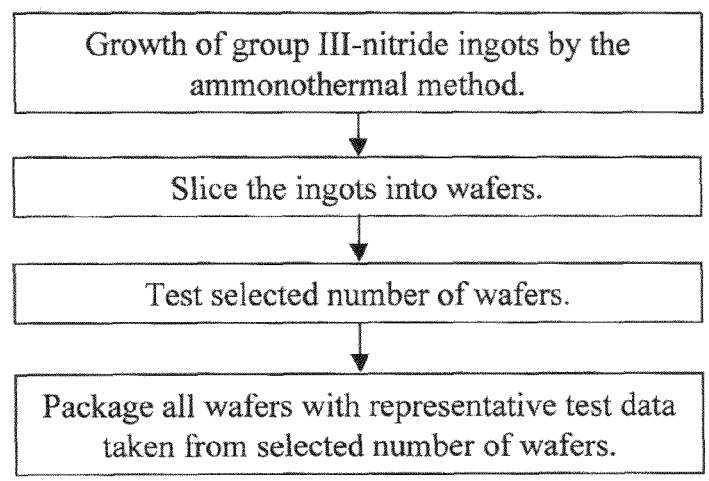
FIG. 1 is a flow chart for the production of group III-nitride wafers with improved test scheme in which selected wafers are tested from one ingot.
Figure 2:
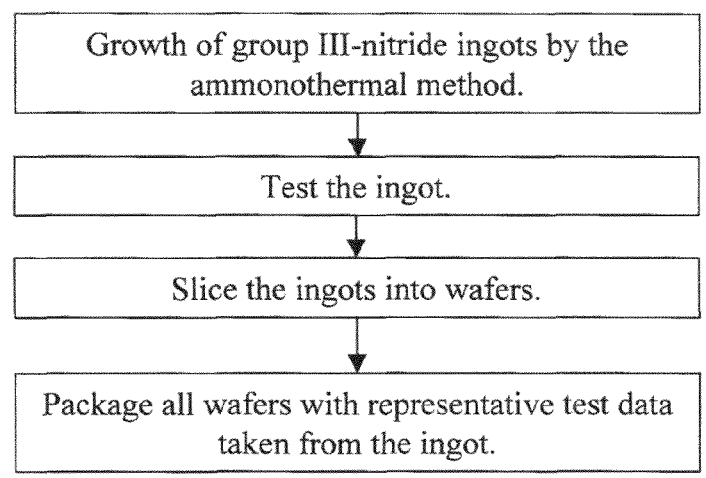
FIG. 2 is a flow chart for the production of group III-nitride wafers with improved test scheme in which an ingot is tested before slicing.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

1. Technical Description of the Invention

GaN wafers are used for blue/green/white LEDs and blue LDs, whose performance and reliability greatly depend on the wafer quality. Thus, customers usually require some sort of quality certificate on products. Currently, a commercial GaN wafer is produced by growing a thick GaN film on heteroepitaxial substrate such as sapphire or gallium arsenide by hydride vapor phase epitaxy (HVPE) and subsequently removing the substrate. The characteristics of each wafer suffer from run-to-run fluctuation of HVPE growth condition. Therefore, to ensure compliance to quality specifications for GaN wafers, it has been necessary to test all HVPE-grown wafers after fabrication. However, as production volume increases, testing all wafers takes too much time, labor and cost. To realize low-cost, high-quality GaN wafers, it is necessary to develop a growth method to obtain GaN ingots so that GaN wafers sliced from the ingot show similar characteristics. Recently, it was proven that the ammonothermal method has sufficient feasibility to grow GaN ingots. Through our recent development of GaN ingot by the ammonothermal method, we found that characteristics of wafers sliced from one ingot show properties with anticipated certain trend. Therefore, we have investigated the possibilities of testing an ingot or selected number of wafers from an ingot to represent other wafers in the same ingot.

Gallium nitride has a wurtzite crystal structure with crystal faces polar and non-polar to the Group III element or elements and the nitrogen incorporated into the crystal structure. Samples or substrates such as wafers may be cut from an ingot along a crystal face, or samples may be cut at a small angle to a crystal face, such as about 3 degrees. Generally, the angle is less than about 10 degrees, and the angle may be in the range of about 5 to 10 degrees.

An ingot is typically a sufficiently large single crystal material from which at least 4 wafers may be cut. Of course, more wafers may be cut from an ingot, such as 5, 6, 7, 8, 9, 10, or more wafers may be cut from an ingot of Group III-nitride material.

Equipment and methods that can be used to grow ingots from which a large number of wafers may be cut are disclosed in copending U.S. and PCT application numbers [not yet assigned] both filed on Jun. 4, 2009 and both entitled "High-Pressure Vessel For Growing Group III Nitride Crystals And Method Of Growing Group III Nitride Crystals Using High-Pressure Vessel And Group III Nitride Crystal", inventors Tadao Hashimoto, Edward Letts, and Masanori Ikari, the contents of which are incorporated by reference herein in their entirety as if put forth in full below. The equipment and methods are also summarized below.

In one instance, a high-pressure vessel having an inner diameter of 1 inch was used to grow bulk GaN ingots. All necessary sources and internal components including polycrystalline GaN nutrient held in a Ni basket, 0.4 mm-thick single crystalline GaN seeds, and 3 to 6 flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. $NaNH_2$ or Na was used as a mineralizer. After loading the mineralizer into the high-pressure vessel, three baffles together with seeds and nutrient were loaded. After sealing the high-pressure vessel, it was taken out of the glove box. Then, the high-pressure vessel was connected to a gas/vacuum system, which can pump down the vessel as well as supply $NH_3$ to the vessel. The high-pressure vessel was heated at 126° C. and evacuated with a turbo molecular pump to achieve pressure less than $1\times10^{-5}$ mbar. The actual pressure before filling ammonia was approximately $1.6\times10^{-6}$ mbar. In this way, residual oxygen and moisture on the inner wall of the high-pressure vessel were removed. After this, the high-pressure vessel was chilled with liquid nitrogen and $NH_3$ was condensed in the high-pressure vessel. Approximately 38.5 g of $NH_3$ was charged in the high-pressure vessel.

After closing the high-pressure valve of the high-pressure vessel, it was transferred to a two zone furnace. The high-pressure vessel was heated up. The crystallization region was maintained at 575-595° C. and the nutrient region was maintained at 510° C. The resulting pressure was approximately 22,000 psi (150 MPa). After designated growth time, ammonia was released and the high-pressure vessel was opened.

Figure 3:
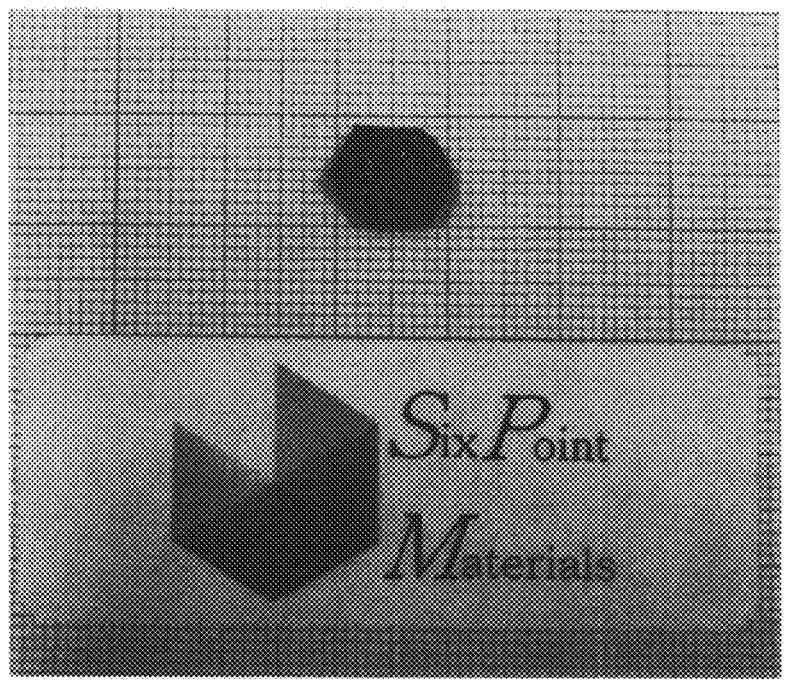
FIG. 3 is a photograph of GaN ingot grown by the ammonothermal method.
Figure 4:
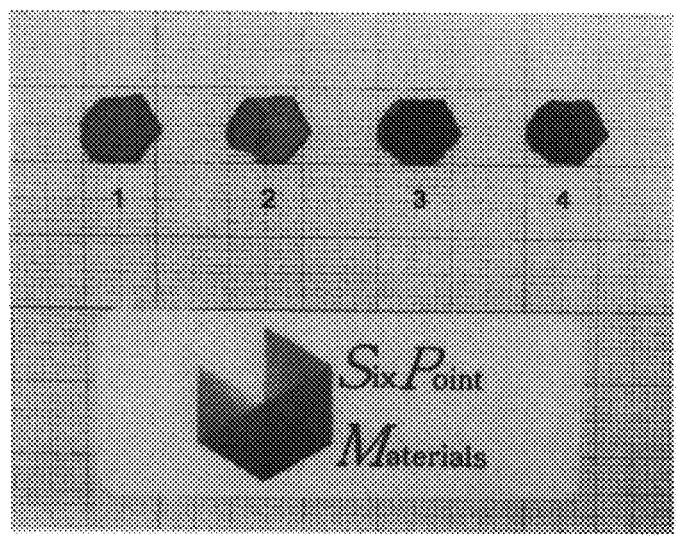
FIG. 4 is a photograph of GaN wafers sliced from the GaN ingot in FIG. 3.

FIG. 3 shows a GaN ingot grown by the ammonothermal method and FIG. 4 shows the wafers sliced along c plane. There was a slight misorientation (up to +/−5 degree) for the cut. The grown bulk crystal ingot was tested with x-ray diffractometer on the surface of Ga-polar c plane (Ga-face) and N-polar c plane (N-face). A typical index used for quality control is a full width half maximum (FWHM) of (002) diffraction peak in rocking curve measurement. The FWHM values measured from the bulk GaN crystal was 6238, and 927 arcsecond on the Ga-face and the N-face, respectively. The FWHM values measured from the original seed crystal was 420 and 381 arcsecond on the Ga-face and the N-face, respectively.

After slicing the bulk crystal along c plane with a wire saw, the each c plane wafer was tested with x-ray diffractometer. The measurement data is plotted in FIG. 5 together with the data of the original seed crystal and the grown bulk crystal. As clearly seen in the figure, the property of each wafer is within the range of values obtained from the ingot measurement. Therefore, is it practical to use the range of the measurement values obtained from the ingot measurement for each wafer's specification. Furthermore, we can estimate the value by studying a certain trend of the measurement value. For example, in the case of using c plane seeds, it has turned out that the x-ray FWHM value became worse for wafers further from the seed crystal (located between positions 2N and 3G) for a portion grown on the Ga-side of the seed (positions 1G, 1N, 2G, 2N), whereas the value did not change much for wafers sliced from the portion grown on the N-side of the seed (for positions 3G, 3N, 4G, 4N). Therefore, one can certify that the measurement value of the wafers on the Ga-side is within the range of the values obtained from the Ga-face and the N-face of the ingot, and the measurement value of the wafers sliced from the N-side is similar to that obtained from the N-face of the ingot.

Figure 5:
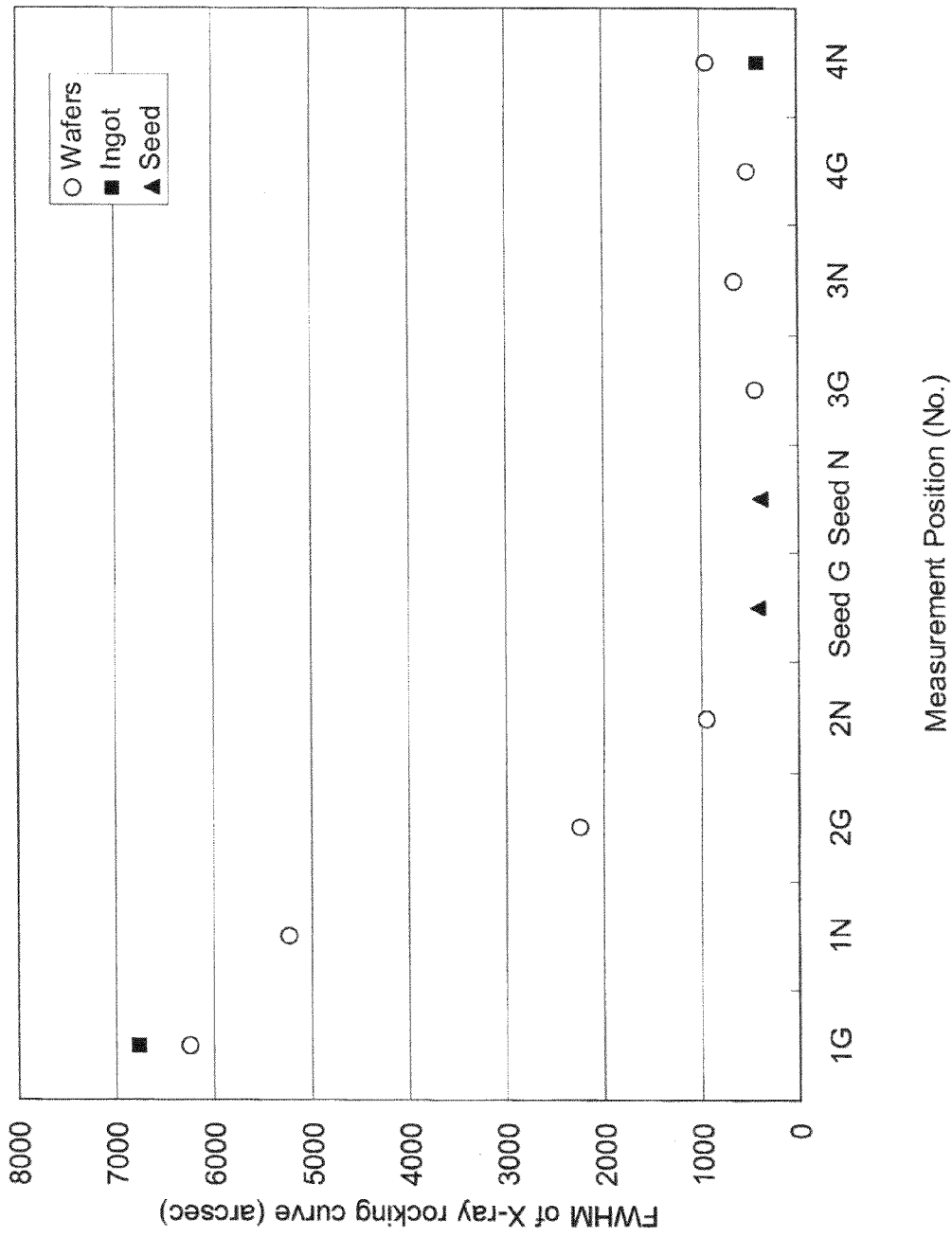
FIG. 5 is full width half maximum of x-ray rocking curve measurement depending on the measurement position. For the bulk ingot, position 1G is on the Ga-face of the ingot and position 4N is on the N-face of the ingot. For the sliced wafers position 1G is on the Ga-face of the wafer 1 (see FIG. 4), position IN is on the N-face of the wafer 1, position 2G is on the Ga-face of the wafer 2, position 2N is on the N-face of the wafer 2, position 3G is on the Ga-face of the wafer 3, position 3N is on the N-face of the wafer 3, position 4G is on the Ga face of the wafer 4, position 4N is on the N-face of the wafer 4. The seed crystal was located between position 2N and 3G as indicated in the figure.

As demonstrated in FIG. 5, one can also measure selected wafers to obtain representative measurement values for other wafers. By using the value on outer-most wafers (i.e. 1G, 1N, 4G and 4N), one can interpolate the quality value of other wafers with less error bar.

Because the ammonothermal method utilizes seed crystals, the test data of the seed crystal before the ammonothermal growth will also represents the wafer characteristics close to the original seed. Therefore, test data from a bulk crystal before slicing or test data from outer-most wafers together with the test data of the original seed and the wafer location will provide more accurate quality values for untested wafers between the seed and the outer-most wafers.

If one bulk ingot produces much more wafers, one can choose wafers for measurement between the outer-most wafers and the original seed position. The quality value of untested wafers can be certified within a certain error bar by providing the measured values and the location of the wafer relative to the measured wafers.

The analysis and correlation may also utilize an end piece of an ingot that might not generally be considered a wafer. In some analyses, only one end piece is used in deriving a correlation. In other analyses, both end pieces may be used in deriving a correlation, and sometimes information from only the end pieces is used to derive a correlation.

Information on a physical property of the seed material may or may not be used in correlating data on the physical property and using the correlation to provide information on untested wafers.

The physical properties that are tested and correlated according to a method herein may be any one or more selected from peak full width half maximum of x-ray diffraction, peak position and/or intensity of photoluminescence, impurity signal from secondary ion mass spectroscopy, conductivity, carrier concentration, and mobility of carriers.

Various statistical correlations may be utilized. For instance, linear or non-linear correlations such as normal or weighted least squares, exponential, and averaging may be utilized to predict values of a property for wafers not tested.

A different statistical correlation may be used for wafers cut from an ingot on one polar side of a seed material than for wafers cut from the opposite polar side of a seed material used to form the ingot. For instance, a linear correlation may be used for a property of wafers taken from the N-polar side of the ingot, and a different linear, a least squares, or an exponential correlation may be used for wafers taken from the Group III-polar side of the wafer. In examining the data from FIG. 5, a linear correlation may adequately describe the data for wafers taken from the N-polar side of the seed material used to grow the ingot, whereas a different linear or a least-squares fit may be used to estimate properties for untested wafers taken from the ingot taken from the Ga-polar side of the seed material.

A property of the wafers, seed, and/or ingot may be assessed using X-rays. One such method is X-ray diffraction, and especially rocking curve X-ray analysis. Other test methods include the use of laser light, electron beam, photo luminescence, cathode luminescence, secondary ion mass spectroscopy, Hall measurement, capacitance-voltage measurement, and other tests used to characterize Group III-nitride materials.

Wafers may be packaged with representative test data taken from a selected number of wafers or the ingot itself. Test data for the seed may instead be supplied with packaged wafers.

2. Advantages and Improvements

The present invention disclosed a new testing method of group III-nitride wafers with improved throughput. In the conventional production method of GaN wafers by HVPE, each produced wafers must be tested because wafers are produced one by one. In the current invention utilizing the ammonothermal method, the property of wafers sliced from one ingot can be easily estimated by measuring the ingot or selected number of wafers. This selected tested scheme reduces significant amount of time, labor and cost.

3. Equipment and Methods

A high-pressure vessel suitable for use in ammonothermal growth of ingots of a Group III-nitride material that produce a large number of wafers may be made from a raw material such as superalloy rod or billet. Conventional vessels are limited in size today when this type of raw material is used to make the high-pressure vessel. Described below is a vessel that allows ingots to be formed that may produce a number of wafers as discussed above.

The vessel may have one or more clamps to seal the vessel. A clamp may be formed of a metal or alloy having grain flow in a radial direction in the clamp. This configuration enables the vessel to be much greater in size than vessels today.

The high-pressure vessel may be divided into at least three regions by flow-restricting devices such as baffles. In this embodiment, the vessel has a nutrient region in which a nutrient such as polycrystalline GaN or other feed material is dissolved or supplied. The vessel also has a crystallization region in which the group III-nitride material is crystallized upon a seed material. The vessel also has a buffer region between the nutrient region and the crystallization region, one or more cool zones adjacent to the crystallization zone and/or the nutrient zone and in the vicinity of a clamp, or both.

Some procedures below can be used to grow crystals with improved purity, transparency and structural quality. Alkali metal-containing mineralizers are charged with minimum exposure to oxygen and moisture until the high-pressure vessel is filled with ammonia. Several methods to reduce oxygen contamination during the process steps are presented. Also, back etching of seed crystals and a temperature ramping scheme to improve structural quality are discussed.

In addition, a method below reduces parasitic deposition of polycrystalline GaN on the inner surface of the pressure vessel while optionally improving structural quality and without reducing growth rate. Because of the retrograde solubility of GaN in the ammonothermal growth using basic mineralizers, the temperature in the crystallization region is conventionally set higher than the temperature in the nutrient region. We, however, discovered that GaN can be grown by setting the temperature of the crystallization region slightly lower than the temperature of the nutrient region. By utilizing this "reverse" temperature setting for growth, parasitic deposition of GaN on the reactor wall was greatly reduced. Moreover, the structural quality of grown crystal was improved without sacrificing growth rate.

The present invention provides a design to achieve a high-pressure vessel suitable for mass production of group III-nitride crystals by the ammonothermal method. With the limited size of available Ni—Cr based precipitation hardenable superalloy, innovative designs are presented to maximize the vessel size. Also, methods of growing improved-quality group III nitride crystals are presented.

In one instance, the reactor has: a body defining a chamber; and a first clamp for sealing an end of the reactor, wherein the first clamp is formed of a metal or alloy having a grain flow in a radial direction in the clamp.

In another instance, the reactor for ammonothermal growth of a group III-nitride crystalline ingot has: a body defining a chamber; a first heater for heating a nutrient region of the reactor; a second heater for heating a crystallization region of the reactor; a third region selected from a buffer region and an end region; and at least one baffle separating the crystallization region from the nutrient region or the crystallization region from an end region of the reactor, with the qualifications that the buffer region when present is defined by a plurality of baffles comprising a first end baffle and an opposite end baffle with one or more optional baffles therebetween, and a distance from the first end baffle to the opposite end baffle of the plurality is at least ⅕ of an inner diameter of the reactor; and the reactor further comprises a first clamp at the end region when the end region is present.

Any of the reactors described herein may have a single opening at an end. Alternatively, any of the reactors described herein may have two or more openings, with one opening at each end of the reactor body. The reactor may be generally cylindrical, or the reactor may be formed in another shape such as spherical or semispherical.

A reactor as discussed herein may have a buffer region and/or one or more cooled end regions.

A clamp for the reactor, such as a clamp positioned in an end region, may be formed of a metal or alloy having a grain flow in a radial direction in the clamp. The clamp may be formed of a superalloy such as a Ni—Cr superalloy. Alternatively, a clamp may be formed of high strength steel.

A reactor may have a first heater that is configured to maintain the nutrient region of the reactor at a temperature near but greater than a temperature of the reactor in a crystallization region of the reactor when the reactor is configured to grow a gallium nitride crystal having retrograde solubility in supercritical ammonia.

The reactor may be configured so that the first heater maintains the nutrient region no more than about 20° C. greater than the temperature of the crystallization region.

Any reactor may have a second clamp for sealing a second end of the reactor. The second clamp may be identical to the first clamp discussed above.

The clamp may be formed in two or three or more pieces so that the clamp can be disassembled and removed from the reactor. The pieces may be held together by bolts formed of the same material as the clamps.

A reactor for ammonothermal growth of a group III-nitride crystalline ingot may also have a body defining a chamber; and a mineralizer in an encapsulant, wherein the encapsulant is an oxygen- and water-impermeable material capable of rupturing under growth conditions in the reactor.

As discussed in further detail below, the encapsulant may be a metal or alloy coating on the mineralizer that softens or melts at crystal growth conditions in the reactor.

The encapsulant may instead or additionally comprise a water- and oxygen-impermeable container that ruptures under crystal growth conditions in the reactor.

The container may have a chamber which contains the encapsulant and has a pressure much less than a pressure within the reactor under crystal growth conditions, so that the pressure on the container exceeds its yield strength when the reactor attains operating pressure and temperature.

Any of the reactors discussed herein may operate using an ammonobasic supercritical solution or an ammonoacidic supercritical solution. The mineralizer may therefore be basic or acidic. Such mineralizers are well-known in the art.

Also discussed herein is a method of forming a group III-nitride crystalline material. The method includes:

providing a mineralizer substantially free of oxygen and water to a reaction chamber of an ammonothermal growth reactor evacuating the chamber growing the group III-nitride crystalline material in the chamber.

Any method herein may include providing an oxygen getter in the reaction chamber.

A method of forming gallium nitride crystalline material may comprise heating a nutrient comprising polycrystalline GaN in a nutrient region of a reactor heating a seed material in a crystallization region of the reactor dissolving the polycrystalline GaN in supercritical ammonia depositing the dissolved GaN on the seed material to grow the gallium nitride crystalline material wherein the temperature of the nutrient region is greater than but near the temperature of the crystallization region.

In such a method, the difference in temperature between the nutrient region and the crystallization region may be no more than about 50, 40, 30, 25, 20, 15, or 10° C. during the act of depositing the dissolved GaN on the seed material.

Any method discussed herein may further comprise back-etching the nutrient prior to the act of growing the crystalline material.

Reactors and methods are discussed in greater detail below.

Technical Description

Since there is a size limitation in forged materials, it is not possible today to obtain large diameter rod of various metals or alloys such as precipitation hardenable Ni—Cr based superalloy from which a pressure vessel suitable for ammonothermal growth of a group III-nitride crystalline material can be made. For example, the maximum diameter of as-cast R-41 billet is 17 inches, and this billet is forged (e.g. round-forged, where the forging pressure is applied along the radial direction) into 12-inch diameter rod before making the reactor. This is the maximum diameter of forged rod in state-of-the-art technology and means that the maximum outer diameter of the high-pressure vessel can be close to 12 inches. However, this maximum diameter cannot be realized using existing methods because it is also necessary to form clamps for the high-pressure vessel from the forged metal or alloy.

For a high-pressure vessel of this scale, a clamp-type closure is safer and more practical due to the increased cover load (i.e. the force applied to lids at the conditions present in ammonothermal crystal growth). A screw-type closure is not practical for a high-pressure vessel having an inner diameter larger than 2 inches because the screw cap requires too many threads to hold the cover load.

However, since the clamp diameter must be larger than the outer diameter of the high-pressure vessel, the maximum outer diameter of the high-pressure vessel is limited by the clamp diameter. Using R-41 for example, the clamp diameter of 12 inch results in a high-pressure vessel with 4-6 inch outer diameter and 2-3 inch inner diameter. Although one can produce 2-inch wafers of GaN with such high-pressure vessel, the productivity is not large enough to compete with other growth methods such as hydride vapor phase epitaxy (HVPE).

EXAMPLE 1

To solve the above-mentioned problem, a few methods to obtain larger clamps were sought and we discovered it is possible to manufacture a large diameter disk with e.g. precipitation hardenable Ni—Cr based superalloy or other metal or alloy by forging as-cast billet along longitudinal direction. With this method, a 17-inch as-cast billet is forged along the longitudinal direction to form a 20-inch diameter, 1-foot thick disk. The forging process usually creates a directional microstructure (grain flow) which determines tensile strength of the material.

The grain flow of the round rod to construct the body and lids is typically along the longitudinal direction whereas the grain flow of the disks to construct the clamps is along the radial direction. While one might expect a disk with radial grain flow rather than axial grain flow to not have sufficient tensile strength to reliably clamp a lid to a reactor body during use, this difference does not have a significant impact on the reliability of the high-pressure vessel as long as the high-pressure vessel is designed with sufficient safety factor. With this method, we designed a high-pressure vessel with 11.5" outer diameter, 4.75" inner diameter, and height larger than 47.5". Since the height of the high-pressure vessel is large, it is necessary to bore a hole from both ends to form a chamber within the reactor vessel. Therefore a high-pressure vessel might require two lids, one on each end. The clamp diameter in this instance is 20" and the thickness is 12", which ensures sufficient strength to hold a lid during crystal growth. A large clamp such as this may be formed of two or more clamp sections that are e.g. bolted together to form the finished clamp.

Figure 6:
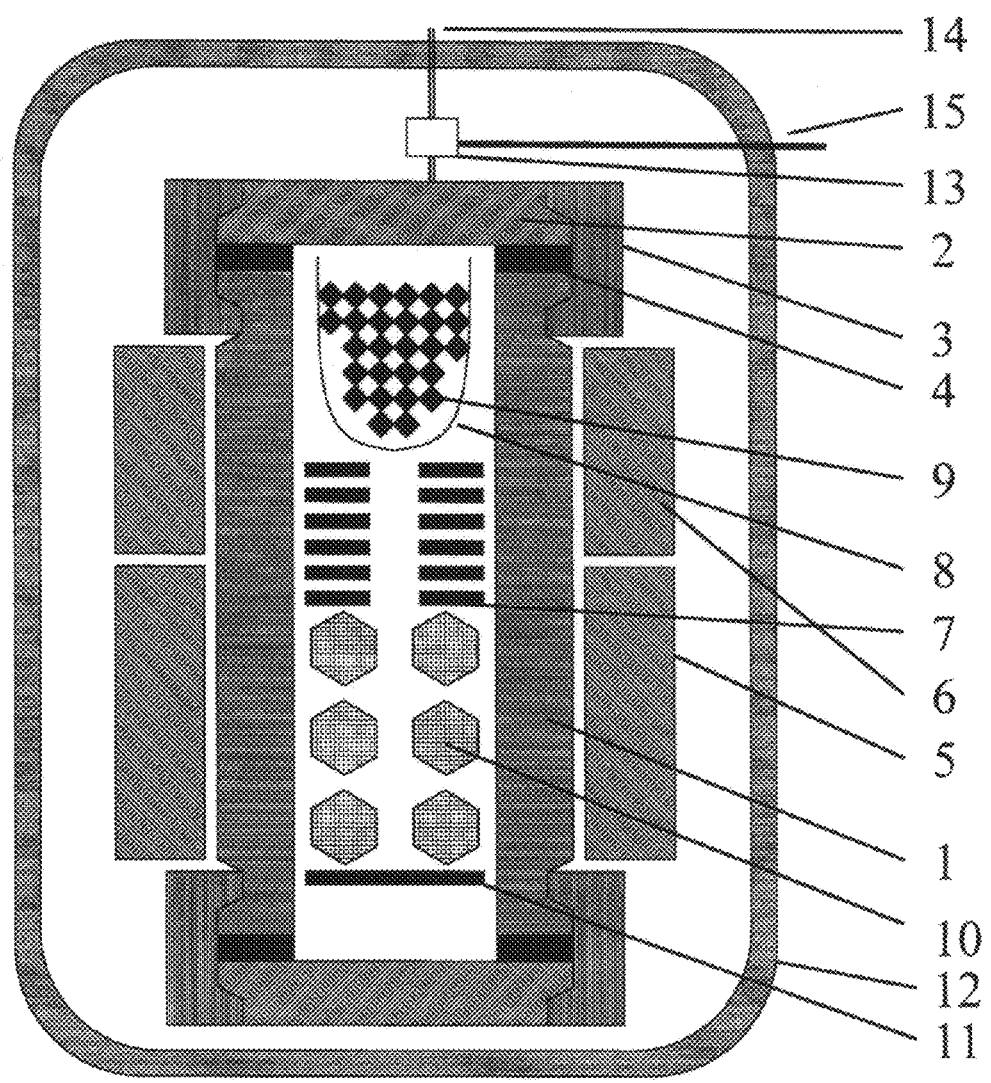
FIG. 6 is a schematic drawing of the high-pressure vessel in this invention. In the figure each number represents the followings.

A large reactor such as the one discussed above provides greater opportunities to improve the quality and size of larger-diameter crystal grown in the reactor. Hot ammonia circulates inside the high-pressure vessel and transfers heat. To establish preferable temperature distribution, flow-restricting baffles may be used. Unlike the conventional ammonothermal reactor, the invented high-pressure vessel may be equipped with a flow restricting baffle to cool the bottom region (11 in FIG. 6). In this way, the temperature around the seal and the clamp is maintained lower than that of the crystallization region to improve reliability. In addition, this temperature distribution prevents unnecessary precipitation of GaN on the bottom lid.

The large reactor design also allows a large buffer region to be incorporated between the crystallization region and the nutrient region. This buffer region may comprise multiple baffles where holes or openings in a baffle are offset from holes or openings in adjacent baffles.

These baffles increase the average residence time within the buffer region while providing some regions of relatively stagnant flow and other regions of vortex flow for ammonia passing through the regions between baffles. The average flow-rate from the nutrient region to the crystallization region in the larger-diameter reactor may also be less than the average flow-rate from the nutrient region to the crystallization region in a smaller-diameter reactor.

The buffer region may also be positioned primarily or exclusively adjacent to the heaters for the nutrient region for a reactor configured to provide a lower temperature in the nutrient region and higher temperature in the crystallization region to take advantage of the retrograde solubility of e.g. GaN in supercritical ammonia. Or, the buffer region may extend past heaters for the crystallization zone to provide earlier heating or cooling of the supercritical ammonia, so that the ammonia solution is more likely to be at the desired temperature when the solution encounters the seed material.

The slower ammonia flow supplied in the crystallization region with its increased residence time in the buffer zone, of the supersaturated ammonia, may thus increase the growth rate as shown in Example 3.

As the size of the high-pressure vessel increases, the total internal volume becomes large. Thus, it is important to mitigate possible blast hazards. The equivalent blast energy in this example is estimated to be as high as 9 lbs TNT. In this example, we designed a blast containment enclosure having ½ inch-thick steel wall (12 in FIG. 6). One important thing is that the ammonia in the high-pressure vessel can be released by remote operation of the high-pressure valve (13 in FIG. 6). The valve can be remote-operated via either mechanical, electrical, or pneumatic way.

EXAMPLE 2

Another method to realize a large diameter high-pressure vessel is to use high-strength steel for the clamp material. Although the maximum practical temperature for high-strength steel (such as 4140) is 550° C., the maximum available size is large enough to fabricate clamps for high-pressure vessel having 12-inch outer diameter. In this case extra caution is necessary to control the clamp temperature. An end region in the reactor that has one or more baffles to impede ammonia flow permits ammonia to cool in an end region, reducing the reactor temperature in that region and allowing a clamp to be formed of a material such as high strength steel that might not otherwise be used to form a clamp. Also, appropriate anti-corrosion coating is advisable in case of ammonia leak since steel is susceptible to corrosion by basic ammonia.

EXAMPLE 3

In this example, a high-pressure vessel having an inner diameter of 1 inch was used to demonstrate the enhanced growth rate by having one or more buffer regions between the crystallization region and the nutrient region. Unlike the Examples 1, 2, this high-pressure vessel has an open end on one side only. The chamber of the high-pressure vessel is divided into several regions. From bottom to top, there were a crystallization region, buffer regions, and a nutrient region. GaN crystals were grown with 2 buffer regions, 5 buffer regions, and 8 buffer regions and the growth rate in each condition was compared. First, the high-pressure vessel was loaded with 4 g of $NaNH_2$, a seed crystal suspended from a flow-restricting baffle having 55 mm-long legs (the first baffle). To create buffer regions, 2 flow restricting baffles with 18 mm legs, 5 flow restricting baffles with 18 mm legs or 8 flow restricting baffles with 10 mm legs were set on top of the first baffle (i.e. buffer regions with height of 18 mm were created for the first two conditions and buffer regions with height of 10 mm were created for the last condition). All of the baffles had ¼" hole at the center and the total opening was about 14%. The baffle holes in this instance were not offset from one another. On top of these baffles, a Ni basket containing 10 g of polycrystalline GaN was placed and the high-pressure vessel was sealed with a lid. All of these loading steps were carried out in a glove box filled with nitrogen. The oxygen and moisture concentration in the glove box was maintained to be less than 1 ppm. Then, the high-pressure vessel was connected to a gas/vacuum system, which can pump down the vessel as well as supply $NH_3$ to the vessel. First, the high-pressure vessel was pumped down with a turbo molecular pump to achieve pressure less than $1 \times 10^{-5}$ mbar. The actual pressure in this example was $2.0 \times 10^{-6}$, $2.4 \times 10^{-6}$ and $1.4 \times 10^{-6}$ mbar for conditions with 2, 5, and 8 buffer regions, respectively. In this way, residual oxygen and moisture on the inner wall of the high-pressure vessel were removed. After this, the high-pressure vessel was chilled with liquid nitrogen and $NH_3$ was condensed in the high-pressure vessel. About 40 g of $NH_3$ was charged in the high-pressure vessel. After closing the high-pressure valve of the high-pressure vessel, the vessel was transferred to a two zone furnace. The high-pressure vessel was heated to 575° C. of the crystallization zone and 510° C. for the nutrient zone. After 7 days, ammonia was released and the high-pressure vessel was opened. The growth rate for conditions with 2, 5, and 8 buffer regions were 65, 131, and 153 microns per day, respectively. The growth rate was increased with increased number of buffer regions between the crystallization region and the nutrient region. One reason for the enhanced growth rate is that the convective flow of ammonia became slower as the buffer regions increased. Another reason is creating larger temperature difference by restricting heat exchange between the nutrient region and crystallization region. Therefore, adjusting the opening of the baffle, changing the position of holes on the baffle, adjusting the height of the buffer region is expected to have a similar effect on growth rate. To enhance the growth rate effectively, it is desirable to maintain the height of the buffer region larger than ⅕ of the inner diameter of the high-pressure vessel so that enough space is created to promote stagnant/vortex flow of ammonia.

Technical Description

Here several methods to improve purity, transparency, and structural quality of GaN grown by the ammonothermal method are presented. The followings examples help illustrate further principles of the claimed invention, as do the preceding examples.

EXAMPLE 4

Figure 7:
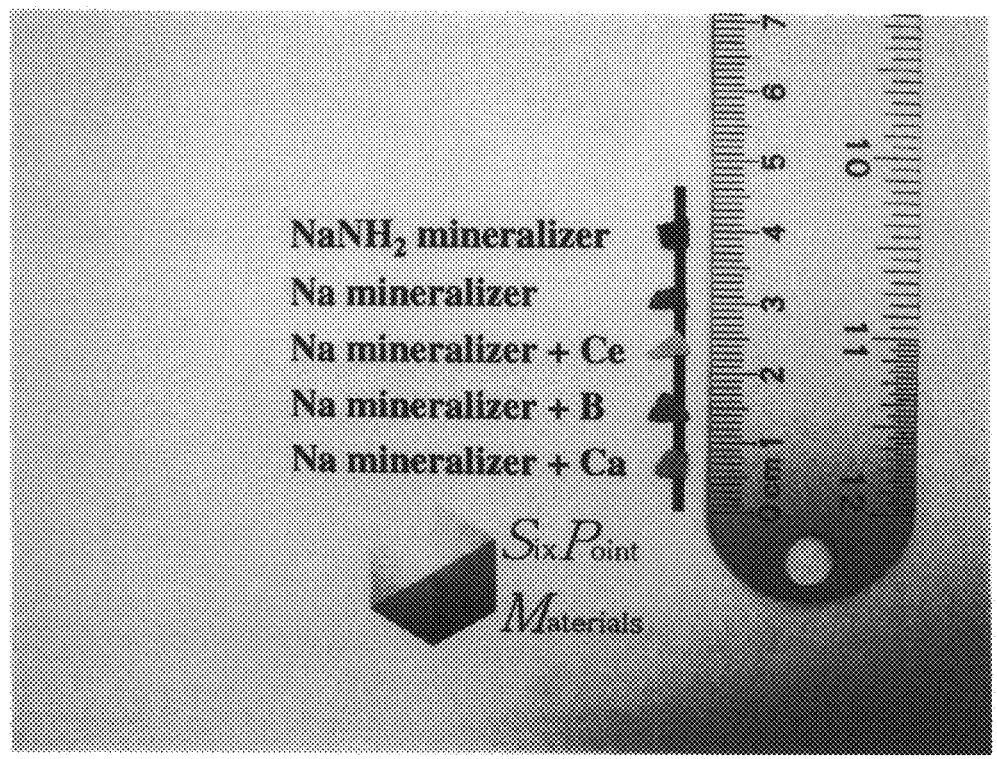
FIG. 7 is a photograph comparing colorations depending on mineralizers and additives.

In this example, a high-pressure vessel having an inner diameter of 1 inch was used to demonstrate the ammonothermal growth steps with high-vacuum pumping before ammonia filling. Unlike the Examples 1, 2, this high-pressure vessel has an open end on one side only. All necessary sources and internal components including 10 g of polycrystalline GaN nutrient held in a Ni basket, 0.3 mm-thick single crystalline GaN seeds, and three flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 4 g of $NaNH_2$ was used as a mineralizer. After loading the mineralizer into the high-pressure vessel, three baffles together with seeds and nutrient were loaded. After sealing the high-pressure vessel, it was taken out of the glove box. Then, the high-pressure vessel was connected to a gas/vacuum system, which can pump down the vessel as well as supply $NH_3$ to the vessel. The high-pressure vessel was heated at 110° C. and evacuated with a turbo molecular pump to achieve pressure less than $1 \times 10^{-5}$ mbar. The actual pressure before filling ammonia was $2.0 \times 10^{-6}$ mbar. In this way, residual oxygen and moisture on the inner wall of the high-pressure vessel were removed. After this, the high-pressure vessel was chilled with liquid nitrogen and $NH_3$ was condensed in the high-pressure vessel. Approximately 40 g of $NH_3$ was charged in the high-pressure vessel. After closing the high-pressure valve of the high-pressure vessel, it was transferred to a two zone furnace. The high-pressure vessel was heated up. The crystallization region was maintained at 575° C. and the nutrient region was maintained at 510° C. After 7 days, ammonia was released and the high-pressure vessel was opened. The grown crystals showed dark brownish color (the top sample in FIG. 7) and the oxygen concentration measured with secondary ion mass spectroscopy (SIMS) was $1.2\text{-}2.8 \times 10^{-20}$ $cm^{-3}$. In this example, pumping and heating of the high-pressure vessel did not contribute to oxygen reduction. This is because the $NaNH_2$ mineralizer contained significant amount of oxygen/moisture as shown in the next example. After minimizing oxygen/moisture content of mineralizers, pumping and heating of the high-pressure vessel is necessary to minimize possible source of oxygen in the process.

EXAMPLE 5

In this example, a high-pressure vessel having an inner diameter of 1 inch was used to demonstrate the ammonothermal growth steps using Na mineralizer with high-vacuum pumping before ammonia filling. Unlike the Examples 1, 2, this high-pressure vessel has an open end on one side. All necessary sources and internal components including 10 g of polycrystalline GaN nutrient held in a Ni basket, 0.3 mm-thick single crystalline GaN seeds, and six flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 2.3 g of Na cube was used as a mineralizer. The surface of the Na was "peeled" to remove oxide layer. However, even in the glovebox, the fresh surface changed color in seconds, which represented instantaneous oxidation of the Na surface. After loading the mineralizer into the high-pressure vessel, six baffles together with seeds and nutrient were loaded. After sealing the high-pressure vessel, it was taken out of the glove box. Then, the high-pressure vessel was connected to a gas/vacuum system, which can pump down the vessel as well as supply $NH_3$ to the vessel. The high-pressure vessel was evacuated at room temperature with a turbo molecular pump to achieve pressure less than $1\times10^{-5}$ mbar. The actual pressure before filling ammonia was $1.5\times10^{-6}$ mbar. In this way, residual oxygen and moisture on the inner wall of the high-pressure vessel were removed. After this, the high-pressure vessel was chilled with liquid nitrogen and $NH_3$ was condensed in the high-pressure vessel. Approximately 40 g of $NH_3$ was charged in the high-pressure vessel. After closing the high-pressure valve of the high-pressure vessel, it was transferred to a two zone furnace. The high-pressure vessel was heated up. The crystallization region was maintained at 575° C. and the nutrient region was maintained at 510° C. After 7 days, ammonia was released and the high-pressure vessel was opened. The coloration of the grown crystals was improved (the second sample from the top in FIG. 7). The oxygen concentration measured by secondary ion mass spectroscopy (SIMS) was $0.7-2.0\times10^{19}$ cm$^{-3}$, which was more than one order of magnitude lower level than the sample in Example 4. Using mineralizer with low oxygen/moisture content together with pumping the high-pressure vessel is shown to be important to minimize oxygen concentration in the crystal.

EXAMPLE 6

As shown in Example 5, reducing oxygen/moisture content of mineralizers is vital for improving purity of GaN. As explained in Example 5, Na surface was oxidized quickly even in the glove box. Therefore, it is important to reduce exposed surface of Na or alkali metal mineralizers. Oxidation of Na was reduced by melting the Na in Ni crucible. A hot plate was introduced in the glovebox mentioned in the Example 5 to heat Ni crucible under oxygen and moisture controlled environment. After removing surface oxide layer of Na, it was placed in a Ni crucible heated on the hot plate. When the Na melts, its surface fully contacts on the bottom and wall of the crucible. Ni foil is placed on the top surface of the Na to minimize exposed surface of Na. Since the Ni crucible is small enough to fit the autoclave and Ni is stable in the growth environment, the Ni crucible containing Na can be loaded in the high-pressure vessel directly. In this way, most of surface of Na is covered with Ni, therefore oxidation of Na is minimized. Any metal which is stable in the supercritical ammonia can be used for crucible material. Typical metal includes Ni, V, Mo, Ni—Cr superalloy, etc.

EXAMPLE 7

Another method to cover fresh surfaces of alkali metal is to punch through alkali metal cake with hollow metal tubing. This way, the sidewall of the alkali metal is automatically covered with the inner wall of the tubing, thus reduces surface area exposed to the environment. For example, a slab-shaped Na sandwiched with Ni foil can be prepared by attaching Ni foil immediately after cutting top or bottom surface of the slab. Although the sidewall of the slab is not covered, punching through the Na slab with Ni tubing can create Na cake with sidewall attaching to Ni and top and bottom surface covered with Ni foil. In this way, oxygen/moisture content of alkali metal mineralizer can be greatly reduced.

EXAMPLE 8

When the high-pressure vessel becomes large, it is impossible to load mineralizers to the high-pressure vessel in a glove box. Therefore it is necessary to take alternative procedure to avoid exposure of mineralizers to oxygen/moisture. One method is to use an airtight container which cracks under high pressure. Here is one example of the procedure. Mineralizer is loaded into the airtight container in the glove box. If alkali metal is used, it can be melted and solidified in the way explained in Example 6. Then, the high pressure vessel is loaded with the airtight container and all other necessary parts and materials under atmosphere. After sealing the high-pressure vessel, it is pumped down and heated to evacuate residual oxygen/moisture. Ammonia is charged in the high-pressure vessel and the high-pressure vessel is heated to grow crystals. When internal ammonia pressure exceeds cracking pressure of the airtight container, the mineralizer is released into the ammonia. In this way, mineralizers can be added to ammonia without exposing them to oxygen and moisture.

EXAMPLE 9

To further reduce oxygen concentration, it is effective to remove oxygen in the high-pressure vessel after the high-pressure vessel is sealed and before the ammonia is charged. One practical procedure is to pump and backfill reducing gas in the high-pressure vessel. The reducing gas such as ammonia and hydrogen reacts with residual oxygen in the high-pressure vessel and form water vapor. Therefore, it is further effective to heat the high-pressure vessel to enhance the reduction process.

EXAMPLE 10

In this example, a high-pressure vessel having an inner diameter of 1 inch was used to demonstrate the ammonothermal growth steps with Ce addition as an oxygen getter. Unlike the Examples 1, 2, this high-pressure vessel has an open end on one side. All necessary sources and internal components including 5 g of polycrystalline GaN nutrient held in a Ni basket, 0.4 mm-thick single crystalline GaN seeds, and six flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 2.4 g of Na was used as a mineralizer. After loading the mineralizer into the high-pressure vessel, six baffles together with seeds and nutrient were loaded. Then, 0.4 g of Ce powder was added. After sealing the high-pressure vessel, it was taken out of the glove box. The high-pressure vessel was connected to a gas/vacuum system, which can pump down the vessel as well as supply $NH_3$ to the vessel. The high-pressure vessel was evacuated with a turbo molecular pump to achieve pressure less than $1\times10^{-5}$ mbar. The actual pressure before filling ammonia was $2.6\times10^{-6}$ mbar. In this way, residual oxygen and moisture on the inner wall of the high-pressure vessel were removed. After this, the high-pressure vessel was chilled with liquid nitrogen and $NH_3$ was condensed in the high-pressure vessel. Approximately 40 g of $NH_3$ was charged in the high-pressure vessel.

After closing the high-pressure valve of the high-pressure vessel, it was transferred to a two zone furnace. The high-pressure vessel was heated up. First, the furnace for the crystallization region was maintained at 510° C. and the nutrient region was maintained at 550° C. for 24 hours. This reverse temperature setting was discovered to be beneficial for improving crystal quality as shown in Example 1. Then, the temperatures for the crystallization region and the nutrient region were set to 575 and 510° C. for growth. After 4 days, ammonia was released and the high-pressure vessel was opened. The grown crystal showed yellowish color (the middle sample in FIG. 7), which represented improvement of transparency.

When 0.1 g of Ca lump was added instead of Ce, the grown crystal was semi transparent with slight tan color (the bottom sample in FIG. 7), which represented improvement of transparency. Similar result can be expected with adding oxygen getter containing Al, Mn, or Fe.

EXAMPLE 11

In this example, a high-pressure vessel having an inner diameter of 1 inch was used to demonstrate the ammonothermal growth steps with B addition as surfactant. Unlike the Examples 1, 2, this high-pressure vessel has an open end on one side. All necessary sources and internal components including 5 g of polycrystalline GaN nutrient held in a Ni basket, one 0.4 mm-thick single crystalline GaN seed, and six flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 2.4 g of Na was used as a mineralizer. After loading the mineralizer into the high-pressure vessel, six baffles together with the seed and nutrient were loaded. Then, 0.1 g of BN platelet was added. After sealing the high-pressure vessel, it was taken out of the glove box. The high-pressure vessel was connected to a gas/vacuum system, which can pump down the vessel as well as supply $NH_3$ to the vessel. The high-pressure vessel was evacuated with a turbo molecular pump to achieve pressure less than $1\times10^{-5}$ mbar. The actual pressure before filling ammonia was $1.8\times10^{-6}$ mbar. In this way, residual oxygen and moisture on the inner wall of the high-pressure vessel were removed. After this, the high-pressure vessel was chilled with liquid nitrogen and $NH_3$ was condensed in the high-pressure vessel. Approximately 40 g of $NH_3$ was charged in the high-pressure vessel. After closing the high-pressure valve of the high-pressure vessel, it was transferred to a two zone furnace. The high-pressure vessel was heated up. First, the furnace for the crystallization region was maintained at 510° C. and the nutrient region was maintained at 550° C. for 24 hours. This reverse temperature setting was discovered to be beneficial for improving crystal quality as shown in Example 1. Then, the temperatures for the crystallization region and the nutrient region were set to 575 and 510° C. for growth. After 4 days, ammonia was released and the high-pressure vessel was opened. The grown crystal showed less brownish color (the second sample from the bottom in FIG. 7), which showed improvement of transparency. Also, the structural quality was improved compared to one with conventional ammonothermal growth [5]. The full width half maximum (FWHM) of X-ray rocking curve from (002) and (201) planes were 295 and 103 arcsec, respectively. These numbers are about 5 times smaller than crystals reported in reference [5]. Similar result can be expected with adding surfactant containing In, Zn, Sn, or Bi.

EXAMPLE 12

Figure 8:
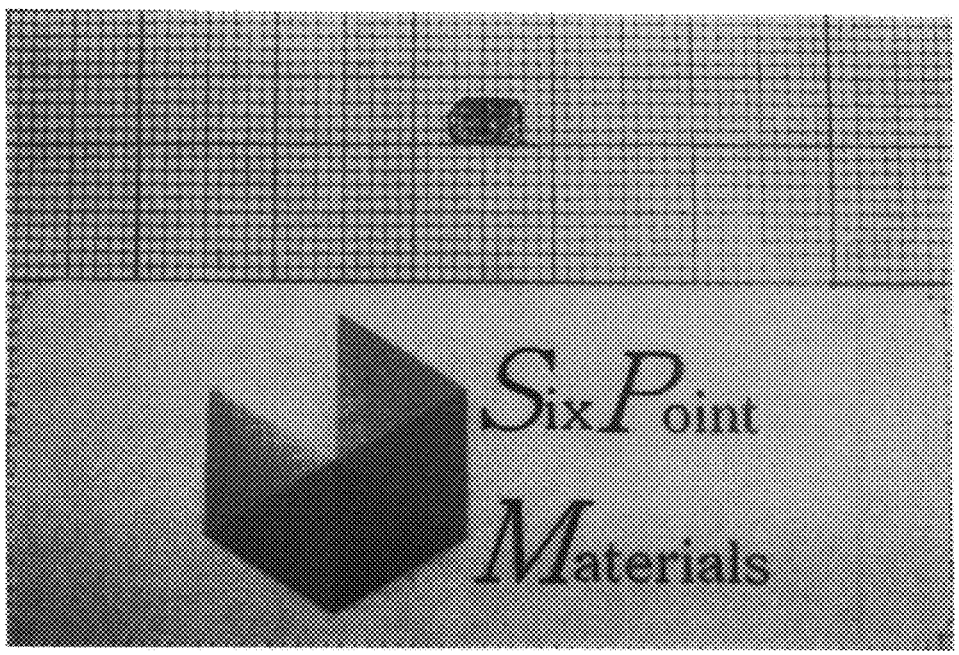
FIG. 8 is a photograph of GaN crystal with Mg additive.

In this example, a high-pressure vessel having an inner diameter of 1 inch was used to demonstrate the ammonothermal growth steps with Mg addition as an oxygen getter. Unlike the Examples 1, 2, this high-pressure vessel has an open end on one side. All necessary sources and internal components including 5 g of polycrystalline GaN nutrient held in a Ni basket, 0.4 mm-thick single crystalline GaN seeds, and six flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 2.4 g of Na was used as a mineralizer. As explained in Example 6, Na was melted in Ni crucible, capped with Ni foil and solidified. 0.1 g of Mg was added in the Ni crucible on top of the Ni foil. After loading the Ni crucible into the high-pressure vessel, six baffles together with seeds and nutrient were loaded. After sealing the high-pressure vessel, it was taken out of the glove box. The high-pressure vessel was connected to a gas/vacuum system, which can pump down the vessel as well as supply $NH_3$ to the vessel. The high-pressure vessel was evacuated with a turbo molecular pump to achieve pressure less than $1\times10^{-5}$ mbar. The actual pressure before filling ammonia was $1.4\times10^{-7}$ mbar. In this way, residual oxygen and moisture on the inner wall of the high-pressure vessel were removed. After this, the high-pressure vessel was chilled with liquid nitrogen and $NH_3$ was condensed in the high-pressure vessel. Approximately 40 g of $NH_3$ was charged in the high-pressure vessel. After closing the high-pressure valve of the high-pressure vessel, it was transferred to a two zone furnace. The high-pressure vessel was heated up. For the first 24 hours, only the furnace for the nutrient region was turned on and maintained at 550° C. while maintaining the furnace for the crystallization region off in order to back etch the surface of the seed. This reverse temperature setting was discovered to be beneficial for improving crystal quality as shown in Example 1. Then, the temperatures for the crystallization region and the nutrient region were set to 590 and 575° C. for growth. After 9days, ammonia was released and the high-pressure vessel was opened. The grown crystal showed almost transparent as shown in FIG. 8. Thus, reducing oxygen contamination in the process is very effective to improve transparency of the crystal.

EXAMPLE 13

Seed crystals are usually prepared by slicing bulk GaN with wire saw followed by polishing. There is a damage layer at the surface of the seeds created by these slicing and polishing process. To improve structural quality of GaN, it is necessary to remove this damage layer. In addition, impurities physically or chemically adsorbed on the seed surface can be removed with back etching. In this example, a high-pressure vessel having an inner diameter of 1 inch was used to demonstrate the back etching of the seed in the ammonothermal high-pressure vessel. Unlike the Examples 1, 2, this high-pressure vessel has an open end on one side. A GaN seed crystal was back etched by setting the temperature of the crystallization region lower than that of the nutrient region.

All necessary sources and internal components including 10 g of polycrystalline GaN nutrient held in a Ni basket, one 0.4 mm-thick single crystalline GaN seed, and six flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 4 g of NaNH$_2$ was used as a mineralizer. After loading the mineralizer into the high-pressure vessel, six baffles together with the seed and nutrient were loaded. After sealing the high-pressure vessel, it was taken out of the glove box. Then, the high-pressure vessel was connected to a gas/vacuum system, which can pump down the vessel as well as supply NH$_3$ to the vessel. The high-pressure vessel was heated at 125° C. and evacuated with a turbo molecular pump to achieve pressure less than $1\times10^{-5}$ mbar. The actual pressure before filling ammonia was $1.8\times10^{-6}$ mbar. In this way, residual oxygen and moisture on the inner wall of the high-pressure vessel were removed. After this, the high-pressure vessel was chilled with liquid nitrogen and NH$_3$ was condensed in the high-pressure vessel. Approximately 40 g of NH$_3$ was charged in the high-pressure vessel. After closing the high-pressure valve of the high-pressure vessel, it was transferred to a two zone furnace. The high-pressure vessel was heated up. The furnace for the crystallization region was maintained off and the nutrient region was maintained at 550° C. The actual temperature measured in the crystallization region was 366° C. It is very important to maintain the temperature difference more than 50° C. to avoid GaN deposition on the seed due to concentration gradient. After 24 hours, ammonia was released and the high-pressure vessel was opened. The seed crystal was back etched by 36 microns, which is sufficient to remove damage layer created by slicing and polishing.

EXAMPLE 14

Although GaN has retrograde solubility at temperatures higher than approximately 400° C., the solubility has normal (i.e. positive) dependence on temperature below approximately 400° C. Therefore it is possible to back etch the seed crystals by setting the crystallization zone lower than 400° C. and maintaining the temperature of crystallization zone higher than that of other zones. It is important to maintain the temperature of the nutrient region at least 50° C. lower than the crystallization region to avoid GaN deposition on the seed due to concentration gradient.

EXAMPLE 15

Seed crystals are usually prepared by slicing bulk GaN with wire saw followed by polishing. There is a damage layer at the surface of the seeds created by these slicing and polishing process. To improve structural quality of GaN, it is necessary to remove this damage layer. In addition, impurities physically or chemically adsorbed on the seed surface can be removed by back etching. In this example, seed crystals were back etched in a separate reactor prior to the ammonothermal growth. Seed crystals with thickness of approximately 0.4 mm were loaded in a furnace reactor which can flow ammonia, hydrogen chloride, hydrogen and nitrogen. In this example, seed crystals were etched in mixture of hydrogen chloride, hydrogen and nitrogen. The flow rate of hydrogen chloride, hydrogen and nitrogen was 25 sccm, 60 sccm, and 1.44 slm, respectively. The etching rate was 7, 21, 35, and 104 microns/h for 800, 985, 1000, 1050° C. Therefore, back etching above 800° C. gives sufficient removal of the surface layer.

EXAMPLE 16

We discovered that structural quality of grown crystals was improved by utilizing reverse temperature condition during initial temperature ramp. In this example, a high-pressure vessel having an inner diameter of 1 inch was used to demonstrate the effect of reverse temperature setting in the initial stage of growth. Unlike the Examples 1, 2, this high-pressure vessel has an open end on one side. All necessary sources and internal components including 10 g of polycrystalline GaN nutrient held in a Ni basket, 0.4 mm-thick single crystalline GaN seeds, and three flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 4 g of NaNH$_2$ was used as a mineralizer. After loading the mineralizer into the high-pressure vessel, three baffles together with seeds and nutrient were loaded. After sealing the high-pressure vessel, it was taken out of the glove box. Then, the high-pressure vessel was connected to a gas/vacuum system, which can pump down the vessel as well as supply NH$_3$ to the vessel. The high-pressure vessel was heated at 120° C. and evacuated with a turbo molecular pump to achieve pressure less than $1\times10^{-5}$ mbar. The actual pressure before filling ammonia was $1.5\times10^{-6}$ mbar. In this way, residual oxygen and moisture on the inner wall of the high-pressure vessel were removed. After this, the high-pressure vessel was chilled with liquid nitrogen and NH$_3$ was condensed in the high-pressure vessel. Approximately 40 g of NH$_3$ was charged in the high-pressure vessel. After closing the high-pressure valve of the high-pressure vessel, it was transferred to a two zone furnace and heated up. The furnace for the crystallization region was maintained at 510° C. and the nutrient region was maintained at 550° C. for 6 hours. Then, the temperatures for the crystallization region and the nutrient region were set to 575 and 510° C. for growth. After 7 days, ammonia was released and the high-pressure vessel was opened. The grown crystals had thickness of approximately 1 mm. The structural quality was improved compared to one with conventional ammonothermal growth [5]. The full width half maximum (FWHM) of X-ray rocking curve from (002) and (201) planes were 169 and 86 arcsec, respectively.

EXAMPLE 17

We discovered that setting the crystallization temperature slightly lower than the nutrient temperature during growth significantly reduced parasitic deposition of polycrystalline GaN on the inner surface of reactor. Although the GaN has retrograde solubility in supercritical ammonobasic solution, we discovered that GaN crystal growth occurred even with reverse temperature condition. Moreover, structural quality of grown crystal was improved without sacrificing growth rate.

A high-pressure vessel having an inner diameter of 1 inch was used to demonstrate the effect of reverse temperature setting during growth. Unlike the Examples 1, 2, this high-pressure vessel has an open end on one side. All necessary sources and internal components including 10 g of polycrystalline GaN nutrient held in a Ni basket, 0.47 mm-thick single crystalline GaN seeds, and six flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 2.6 g of Na solidified in Ni crucible and capped with Ni foil as explained in Example 6 was used as a mineralizer. After loading the Ni crucible into the high-pressure vessel, six baffles together with seeds and nutrient basket were loaded. After sealing the high-pressure vessel, it was taken out of the glove box. Then, the high-pressure vessel was connected to a gas/vacuum system, which can pump down the vessel as well as supply $NH_3$ to the vessel. The high-pressure vessel was and evacuated with a turbo molecular pump to achieve pressure less than $1 \times 10^{-5}$ mbar. The actual pressure before filling ammonia was $9.5 \times 10^{-8}$ mbar. In this way, residual oxygen and moisture on the inner wall of the high-pressure vessel were removed. After this, the high-pressure vessel was chilled with liquid nitrogen and $NH_3$ was condensed in the high-pressure vessel. Approximately 44 g of $NH_3$ was charged in the high-pressure vessel. After closing the high-pressure valve of the high-pressure vessel, it was transferred to a two zone furnace and heated up. For the first 24 hours, the furnace for the crystallization zone and nutrient zone were ramped and maintained at 360° C. and 570° C., respectively. As explained in Example 1, this reverse temperature setting ensures back etching of the seed. Then, the crystallization zone was heated and maintained to 535° C. in about 10 minutes and the nutrient region was cooled from 570° C. down to 540° C. in 24 hours. The slow cooling of the nutrient region is expected to reduce sudden precipitation of GaN in the initial stage of growth. After the temperature of the nutrient region became 540° C., this reverse temperature setting (i.e. 535° C. for crystallization region and 540° C. for nutrient region) was maintained for 3 more days. Then, the ammonia was released, reactor was unsealed and cooled. The grown crystals had thickness of approximately 1.2 mm. The average growth rate was 0.183 mm/day. The structural quality was improved compared to one with conventional ammonothermal growth [5]. The full width half maximum (FWHM) of X-ray rocking curve from (002) and (201) planes were 56 and 153 arcsec, respectively. Also, parasitic deposition was about 0.3 g, which was more than 50% reduced compared to the conventional temperature setting.

Advantages and Improvements

The disclosed improvements enable mass production of high-quality GaN wafers via ammonothermal growth. By utilizing the new high-pressure vessel design, one can maximize the high-pressure vessel with size limitation of available Ni—Cr based precipitation hardenable superalloy. Procedures to reduce oxygen contamination in the growth system ensures high-purity GaN wafers. Small amount of additives such as Ce, Ca, Mg, Al, Mn, Fe, B, In, Zn, Sn, Bi helps to improve crystal quality. In-situ or ex-situ back etching of seed crystals is effective way to remove damaged layer and any adsorbed impurities from GaN seeds. In addition, reverse temperature setting even for growth scheme is beneficial for reducing parasitic deposition of polycrystalline GaN on the inner surface of the reactor and improving structural quality. These techniques help to improve quality of group III nitride crystals and wafers.

Possible Modifications

Although the preferred embodiment describes a two-zone heater, the heating zone can be divided into more than two in order to attain favorable temperature profile. Although the preferred embodiment describes the growth of GaN as an example, other group III-nitride crystals may be used in the present invention. The group III-nitride materials may include at least one of the group III elements B, Al, Ga, and In.

Although the preferred embodiment describes the use of polycrystalline GaN nutrient, other form of source such as metallic Ga, amorphous GaN, gallium amide, gallium imide may be used in the present invention.

In the preferred embodiment specific growth apparatuses are presented. However, other constructions or designs that fulfill the conditions described herein will have the same benefit as these examples.

Although the example in the preferred embodiment explains the process step in which $NH_3$ is released at elevated temperature, $NH_3$ can also be released after the high-pressure vessel is cooled as long as seizing of screws does not occur.

Although the preferred embodiment describes the X-ray diffraction as a testing method, the main idea can be applied to other methods such as photo luminescence, cathode luminescence, secondary ion mass spectroscopy, Hall measurement, and capacitance measurement.

Although the preferred embodiment describes the c plane wafers, the benefit can be obtained for wafers of other orientation such as m plane, a plane and various semipolar planes.

In the preferred embodiment specific growth apparatuses is presented. However, other constructions or designs that fulfill the conditions described herein will have the same benefit as these examples.

The present invention does not have any limitations on the size of the wafer, so long as the same benefits can be obtained.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

The following references are incorporated by reference herein:

[1]. S. Porowski, MRS Internet Journal of Nitride Semiconductor, Res. 4S1, (1999) G1.3.
[2]. T. Inoue, Y. Seki, O. Oda, S. Kurai, Y. Yamada, and T. Taguchi, Phys. Stat. Sol. (b), 223 (2001) p. 15.
[3]. M. Aoki, H. Yamane, M. Shimada, S. Sarayama, and F. J. DiSalvo, J. Cryst. Growth 242 (2002) p. 70.
[4]. T. Iwahashi, F. Kawamura, M. Morishita, Y. Kai, M. Yoshimura, Y. Mori, and T. Sasaki, J. Cryst Growth 253 (2003) p. 1.
[5]. T. Hashimoto, F. Wu, J. S. Speck, S. Nakamura, Jpn. J. Appl. Phys. 46 (2007) L889.
[6]. R. Dwiliński, R. Doradziński, J. Garczyński, L. Sierzputowski, Y. Kanbara, U.S. Pat. No. 6,656,615.
[7]. K. Fujito, T. Hashimoto, S. Nakamura, International Patent Application No. PCT/US2005/024239, WO07008198.
[8]. T. Hashimoto, M. Saito, S. Nakamura, International Patent Application No. PCT/US2007/008743, WO07117689/See also US20070234946, U.S. application Ser. No. 11/784,339 filed on Apr. 6, 2007.

What is claimed is:

1. A method of testing a first set of group III-nitride substrates cut from an ingot formed using a seed material, said method comprising
   a) selecting substrates from the first set of substrates to form a second set of substrates, the second set of substrates being a subset of the first set and therefore being a selection of substrates from the first set of substrates that does not include all members from the first set of substrates,
b) analyzing samples taken from the substrates of the second set to assess values of a first property of each of the substrates of the second set,
c) determining a correlation for the values of the first property, said correlation being a function of distance of each of said substrates of the second set from a seed used to form the ingot, and
d) applying said correlation to substrates not in said second set of substrates to provide estimated values of said first property for said substrates, wherein
e) the ingot was produced using an ammonothermal process, wherein
f) the testing is carried out on at least one of the crystallographic planes selected from Group III-polar side c plane, nitride-polar side c plane, m plane, or {101} plane, and wherein
g) the substrate is cut at an angle to the crystallographic plane.

2. A method according to claim 1 wherein the substrates of the first set each have a group III-polar face and a nitride polar face.

3. A method according to claim 1 wherein the angle is about 5-10degrees.

4. A method according to claim 1 wherein the group III-nitride substrates are GaN substrates.

5. A method according to claim 1 wherein the act of analyzing samples taken from the substrates of the second set comprises at least one analytical technique selected from the group consisting of X-ray analysis, X-ray diffraction analysis, electron beam analysis, photo luminescence or cathode luminescence, secondary ion mass spectroscopy, Hall measurement, capacitance-voltage measurement, and laser light-assisted analysis.

6. A method according to claim 1 wherein said second set includes at least one outer-most substrate from the ingot.

7. A method according to claim 6 wherein the second set includes at least one wafer from the ingot.

8. A method according to claim 6 wherein said second set consists of at least one outer-most substrate of the original bulk crystal.

9. A method according to claim 8 wherein said second set consists of both outer-most substrates of the original bulk crystal.

10. A method according to claim 6 wherein the outer-most substrate is not a wafer.

11. A method according to claim 1 wherein the act of determining the correlation additionally includes a value of the first property for the seed material.

12. A method of testing a first set of group III-nitride substrates cut from an ingot formed using a seed material, said method comprising
a) selecting substrates from the first set of substrates to form a second set of substrates, the second set of substrates being a subset of the first set and therefore being a selection of substrates from the first set of substrates that does not include all members from the first set of substrates,
b) analyzing samples taken from the substrates of the second set to assess values of a first property of each of the substrates of the second set,
c) determining a correlation for the values of the first property, said correlation being a function of distance of each of said substrates of the second set from a seed used to form the ingot,
d) comparing said correlation against a value of said property for the seed material to assess whether said value of the property for the seed material can be used as an estimate of the property for wafers cut from the ingot, and
e) providing said value of the property for the seed material as the value of the property for said wafers, wherein
f) the ingot was produced using an ammonothermal process, wherein
g) the testing is carried out on at least one of the crystallographic planes selected from Group III-polar side c plane, nitride-polar side c plane, m plane, or {101} plane, and wherein
h) the substrate is cut at an angle to the crystallographic plane.

13. A method according to claim 12 wherein the substrates of the first set each have a group III-polar face and a nitride polar face.

14. A method according to claim 12 wherein the angle is about 5-10 degrees.

15. A method according to claim 12 wherein the group III-nitride substrates are GaN substrates.

16. A method according to claim 12 wherein the act of analyzing samples taken from the substrates of the second set comprises at least one analytical technique selected from the group consisting of X-ray analysis, X-ray diffraction analysis, electron beam analysis, photo luminescence or cathode luminescence, secondary ion mass spectroscopy, Hall measurement, capacitance-voltage measurement, and laser light-assisted analysis.

17. A method according to claim 12 wherein said second set includes at least one outer-most substrate from the ingot.

18. A method according to claim 17 wherein the second set includes at least one wafer from the ingot.

19. A method according to claim 17 wherein said second set consists of at least one outer-most substrate of the new bulk crystal.

20. A method according to claim 19 wherein said second set consists of both outer-most substrates of the new bulk crystal.

21. A method according to claim 17 wherein the outer-most substrate is not a wafer.

22. A method according to claim 12 wherein the act of determining the correlation additionally includes a value of the first property for the seed material.

23. A method according to claim 1 and further comprising providing a set of said substrates with representative test data taken from the ingot.

24. A method according to claim 2 and further comprising providing a set of said substrates with representative test data taken from the ingot.

25. A method according to claim 4 and further comprising providing a set of said substrates with representative test data taken from the ingot.

26. A method according to claim 11 and further comprising providing a set of said substrates with representative test data taken from the ingot.

27. A method according to claim 12 and further comprising providing a set of said substrates with representative test data taken from the ingot.

28. A method according to claim 13 and further comprising providing a set of said substrates with representative test data taken from the ingot.

29. A method according to claim 15 and further comprising providing a set of said substrates with representative test data taken from the ingot.

30. A method according to claim 22 and further comprising providing a set of said substrates with representative test data taken from the ingot.

* * * * *